(12) United States Patent
del Mar Chamarro Marti et al.

(10) Patent No.: US 7,227,481 B2
(45) Date of Patent: Jun. 5, 2007

(54) FEEDBACK DAC CHOPPER STABILIZATION IN A CT SINGLE-ENDED MULTI-BIT SIGMA DELTA ADC

(75) Inventors: Maria del Mar Chamarro Marti, Valencia (ES); Paul John Morrow, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/224,457

(22) Filed: Sep. 12, 2005

(65) Prior Publication Data

US 2006/0071834 A1    Apr. 6, 2006

Related U.S. Application Data

(60) Provisional application No. 60/650,359, filed on Feb. 4, 2005, provisional application No. 60/608,993, filed on Sep. 10, 2004.

(51) Int. Cl.
*H03M 3/00* (2006.01)
(52) U.S. Cl. ........................... 341/143; 341/155
(58) Field of Classification Search ............ 341/143, 341/155, 161
See application file for complete search history.

(56) References Cited

U.S. PATENT DOCUMENTS

| | | | |
|---|---|---|---|
| 5,625,357 A * | 4/1997 | Cabler | 341/143 |
| 5,648,779 A * | 7/1997 | Cabler | 341/143 |
| 6,486,820 B1 * | 11/2002 | Allworth et al. | 341/161 |
| 6,496,128 B2 * | 12/2002 | Wiesbauer et al. | 341/143 |
| 6,531,973 B2 * | 3/2003 | Brooks et al. | 341/143 |
| 6,535,155 B2 * | 3/2003 | Ruha et al. | 341/144 |
| 6,577,185 B1 * | 6/2003 | Chandler et al. | 330/9 |
| 6,697,003 B1 * | 2/2004 | Chen | 341/143 |
| 6,753,801 B2 * | 6/2004 | Rossi | 341/161 |
| 6,870,495 B1 * | 3/2005 | Zadeh et al. | 341/161 |
| 6,909,394 B2 * | 6/2005 | Doerrer et al. | 341/200 |
| 6,917,321 B1 * | 7/2005 | Haurie et al. | 341/144 |
| 6,927,717 B1 * | 8/2005 | Oprescu | 341/143 |
| 6,950,049 B2 * | 9/2005 | Brooks et al. | 341/143 |
| 2003/0112166 A1 * | 6/2003 | Al-Awadhi | 341/143 |
| 2006/0017595 A1 * | 1/2006 | Van Veidhoven et al. | 341/143 |

* cited by examiner

*Primary Examiner*—Jean Bruner Jeanglaude
(74) *Attorney, Agent, or Firm*—Wolf, Greenfield & Sacks, P.C.

(57) ABSTRACT

A multi-bit sigma-delta analog-to-digital converter (ADC) has a single-ended input for receiving an analog input signal. A multi-bit feedback current digital-to-analog converter (IDAC) generates a multi-level feedback current depending on a multibit digital feedback signal from a Flash ADC. The feedback current is summed with the input signal with the feedback current. The summed signal is integrated on a continuous-time basis. The IDAC is selectively connectable to the summing node via a first path and a second path. The first path transmits current from the IDAC to the summing node with a first polarity and the second path transmits current from the IDAC to the summing node with an inverted polarity. This can reduce flicker noise and can allow the converter to operate without any mid-scale biasing current sources.

18 Claims, 9 Drawing Sheets

PRIOR ART

FEEDBACK DAC CHOPPER STABILIZATION IN A CT SINGLE-ENDED MULTI-BIT SIGMA DELTA ADC

This application claims benefit of U. S. Provisional Application No. 60/650,359, filed on Feb. 4, 2005 and also claims benefit of U. S. Provisional Application No. 60/608,993, filed on Sep. 10, 2004.

FIELD OF THE INVENTION

This invention relates to multi-bit sigma delta analog-to-digital converters.

BACKGROUND TO THE INVENTION

Continuous-time (CT) Sigma Delta (ΣΔ) analog-to-digital converters (ADC) have received much attention in the last couple of years for applications that require signal bandwidths of several MHz. Continuous-time ADCs are more favourable over switched-capacitor ADCs due to their lower power requirements. Other advantages include better noise immunity due to their inherent anti-aliasing properties, which is especially advantageous in RF receivers. Also, the technology trend towards very deep submicron processes dictates lower power supply voltages. As a consequence, switched capacitor based circuits require boot-strapping techniques to drive the switches in order to extend the dynamic range and sampling rates of the converter. Continuous-time ADCs avoid such problems and much higher signal bandwidths can be attained.

Despite the advantages mentioned above in using continuous-time ΣΔ ADCs, audio band ADC implementations have remained in the discrete time domain. This is because discrete time ADCs achieve relatively high linearity, they are very tolerant of clock jitter, and as high signal bandwidths are not required moderate sampling rates can be employed in sigma-delta based ADCs. Also, chopper stabilisation can be readily employed in discrete-time to remove the flicker noise especially problematic in deep submicron MOS devices.

A discrete-time ADC implementation would seem to be advantageous over a continuous-time ADC for audio band applications for the reasons just mentioned. However, relatively large signal ranges, e.g. 2 Vrms, used for television audio are outside the voltage range that switched-capacitor based circuits implemented in deep sub-micron process technologies can easily interface to. The input voltage range must be constrained to the allowed limits dictated by the process technology. In this case, the only solution would be to attenuate the input signal and thus surrender valuable dynamic range. Even after attenuating the input signal, anti-alias filtering circuitry and buffering circuitry would be required to drive the switched-capacitor input stage.

OEMs typically demand that this functionality is provided on-chip, inevitably leading to an increased die cost along with deteriorated noise performance.

The motivation for using a continuous-time front-end ΣΔ modulator in this application is that it avoids having to attenuate, anti-alias filter and buffer the input. However, there remain problems in using a continuous-time front-end ΣΔ ADC.

Figure 1:
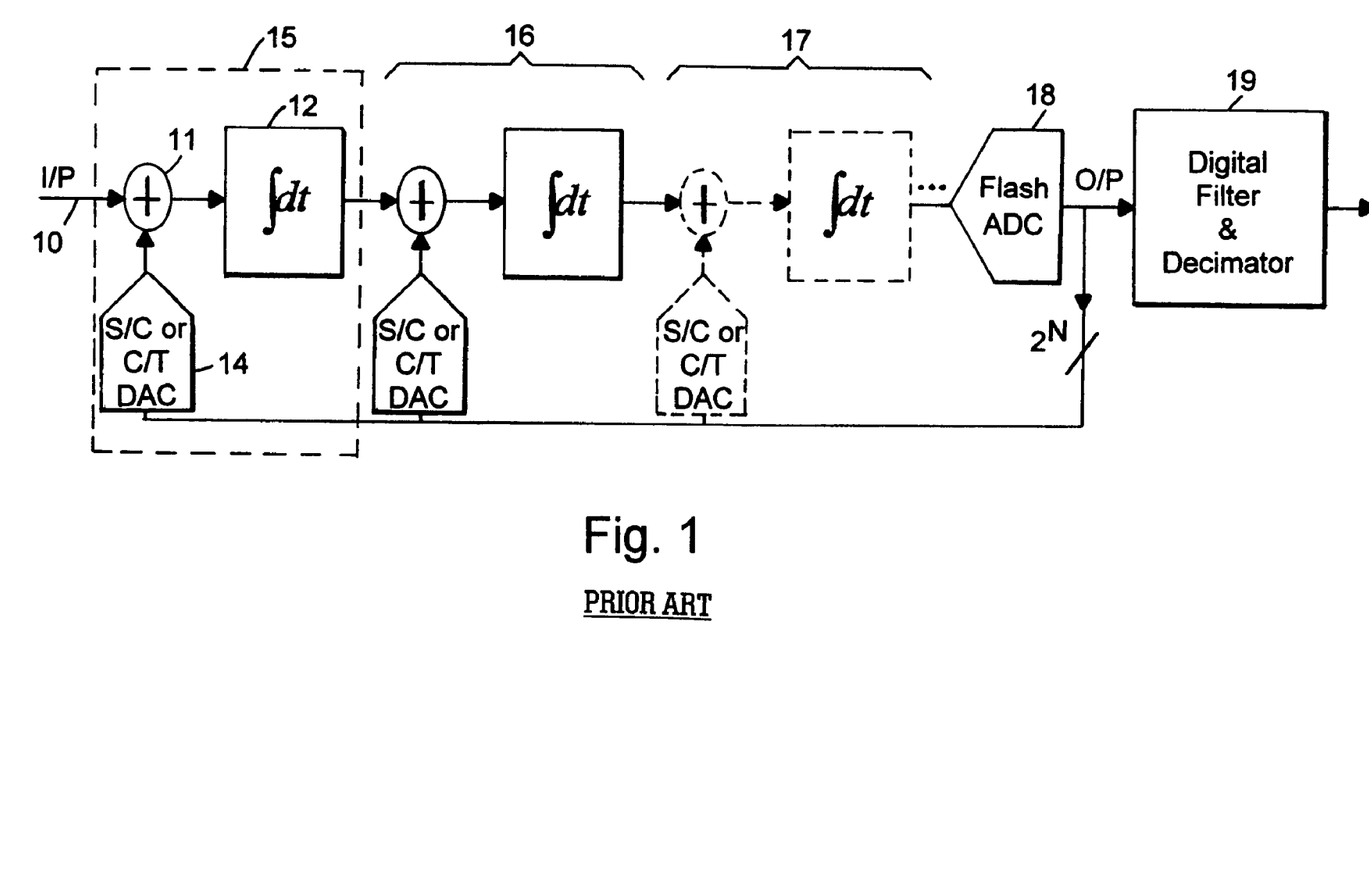
FIG. 1 schematically shows a multi-bit sigma delta ADC.

FIG. 1 illustrates a generalized topology as used in a multi-bit sigma delta ADC. In a conventional manner, the multi-level output of the feedback DAC 14 is summed 11 with an input signal 10 and the resulting output is integrated 12. The subsequent integrator stages 16, 17 following the first stage 15 can be continuous-time or discrete-time. A Flash ADC 18 converts the output of the last integrator stage 17 into a multi-bit digital code which is fed back to the DACs within stages 15, 16, 17. A digital filter and decimator 19 converts the output into a digital code having a desired resolution.

Figure 2:
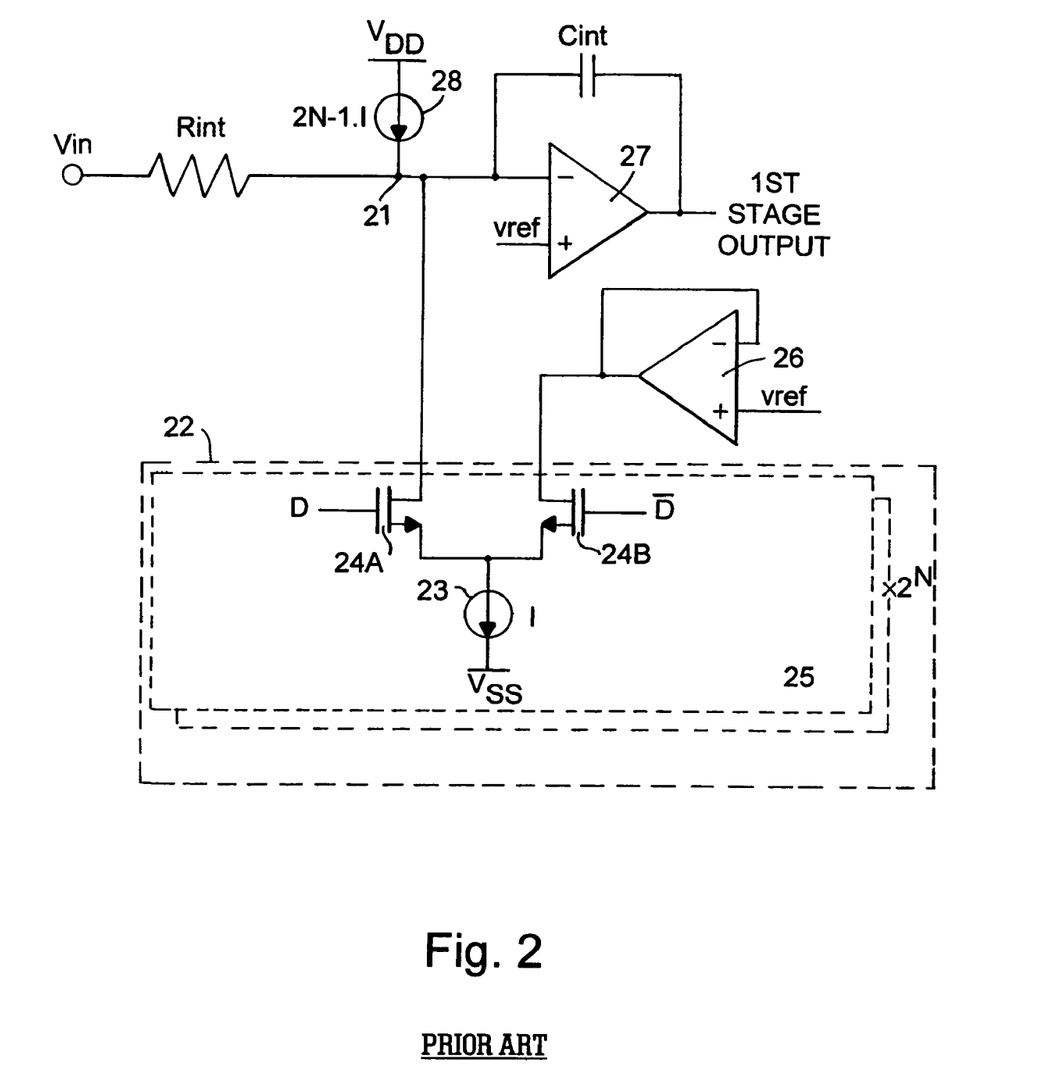
FIG. 2 shows a single-ended front-end for use in the converter of FIG. 1.

In FIG. 1, a single-ended continuous-time (CT) sigma delta ADC input stage 15 requires the use of a single-ended feedback IDAC 14. FIG. 2 illustrates a typical solution, or structure, for a single-ended input continuous-time ADC. This corresponds to stage 15 in FIG. 1. An input signal Vin is converted to a current by resistor Rint which flows into a summing node 21. The feedback path includes a current digital-to-analog converter (IDAC) 22 which comprises a set of $2^N$ unit value current digital-to-analog converters (IDACs) 25, only one of which is shown. The set of IDACs 25 are also connected to the summing node 21. Each IDAC 25 comprises a first branch which is connected to the summing node 21 via a switch 24A and a second branch which is connected to an op-amp 26 via a switch 24B. Each IDAC 25 receives a selection signal D. The selection signal is applied directly to switch 24A and inverted before being applied to switch 24B. An integrator amplifier 27 integrates the output on a continuous basis.

The circuit shown in FIG. 2 has certain disadvantages, including: (1) common-mode noise is not rejected in this single-ended input structure; (2) even harmonics produced in the IDAC are not cancelled; (3) chopping the IDAC current sources, as well as the DC biasing current source flicker noise, is not possible in this single-ended input structure.

The present invention seeks to provide an improved ADC.

SUMMARY OF THE INVENTION

A multi-bit sigma-delta analog-to-digital converter (ADC), as set out in the appended claims, has a multi-bit feedback current digital-to-analog converter (IDAC) which generates a multi-level feedback current. An input signal is summed with the feedback current at a summing node. The IDAC is selectively connectable to the summing node via a first path and a second path. The first path transmits current from current sources within the IDAC to the summing node with a first polarity and the second path transmits current from the IDAC to the summing node with an inverted polarity. The provisioning of first and second paths which transmit current with opposite polarity can reduce flicker noise. The feedback signal is typically a multibit digital feedback signal derived from a Flash ADC at a downstream stage.

A first aspect of the present invention provides a multi-bit sigma-delta analog-to-digital to-digital converter (ADC) comprising:

a single-ended input for receiving an analog input signal;

a multi-bit feedback current digital-to-analog converter (IDAC) which is operable to generate a multi-level feedback current depending on a feedback signal;

a summing node which is operable to sum the input signal with the feedback current; and an integrator which is operable to integrate the summed signal on a continuous-time basis; wherein the IDAC is selectively connectable to the summing node via a first path and a second path, the first path transmitting current from the IDAC to the summing node with a first polarity, and the second path transmitting current from the IDAC to the summing node with an inverted polarity.

Preferably the IDAC comprises a set of unit IDACs which each have this structure. The unit IDACs are each selectable by the feedback signal.

This arrangement can be used with bias current sources, which are preferably chopper stabilized, or without bias current sources. The provision of first and second paths to the summing node in this manner has an effect of balancing currents within the converter during a mid-scale (no input signal) condition and allows the biasing current sources to be removed. This further reduces flicker noise since the flicker noise that would have been contributed by the bias current sources is no longer present. Another benefit of this arrangement is that the total current through the switching portion of the IDAC is half that of the conventional single-ended IDAC circuit as show in FIG. 2. This is because all currents are used to cancel the incoming signal current whereas conventionally only half of the current sources are used when operating at mid-scale.

Preferably, amplifiers used within the first stage of the ADC are chopper-stabilized. Advantageously, each amplifier uses two gain stages, a first gain stage with a differential input and differential output and a second gain stage having a differential input and single-ended output, with only the first gain stage being chopper-stabilized. The gain of the first stage integrator makes the flicker noise in the amplifiers of successive integrator stages negligible.

The invention provides a signal generated from a method for operating on an analog signal at the front end of a multi-bit sigma-delta analog-to-digital converter (ADC), the method comprising:

providing an analog input signal at a single-ended input;

generating a multi-level feedback current depending on a feedback signal;

summing the input signal with the feedback current; and integrating the summed signal on a continuous-time basis;

and selectively connecting the generated feedback current to the summing node via a first path and a second path, the first path transmitting current to the summing node with a first polarity and the second path transmitting current from the IDAC to the summing node with an inverted polarity.

BRIEF DESCRIPTION OF THE DRAWINGS

Embodiments of the invention will be described with reference to the accompanying drawings in which.

DESCRIPTION OF PREFERRED EMBODIMENTS

This invention is not limited in its application to the details of construction and the arrangement of components set forth in the following description or illustrated in the drawings. The invention is capable of other embodiments and of being practised or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Figure 3:
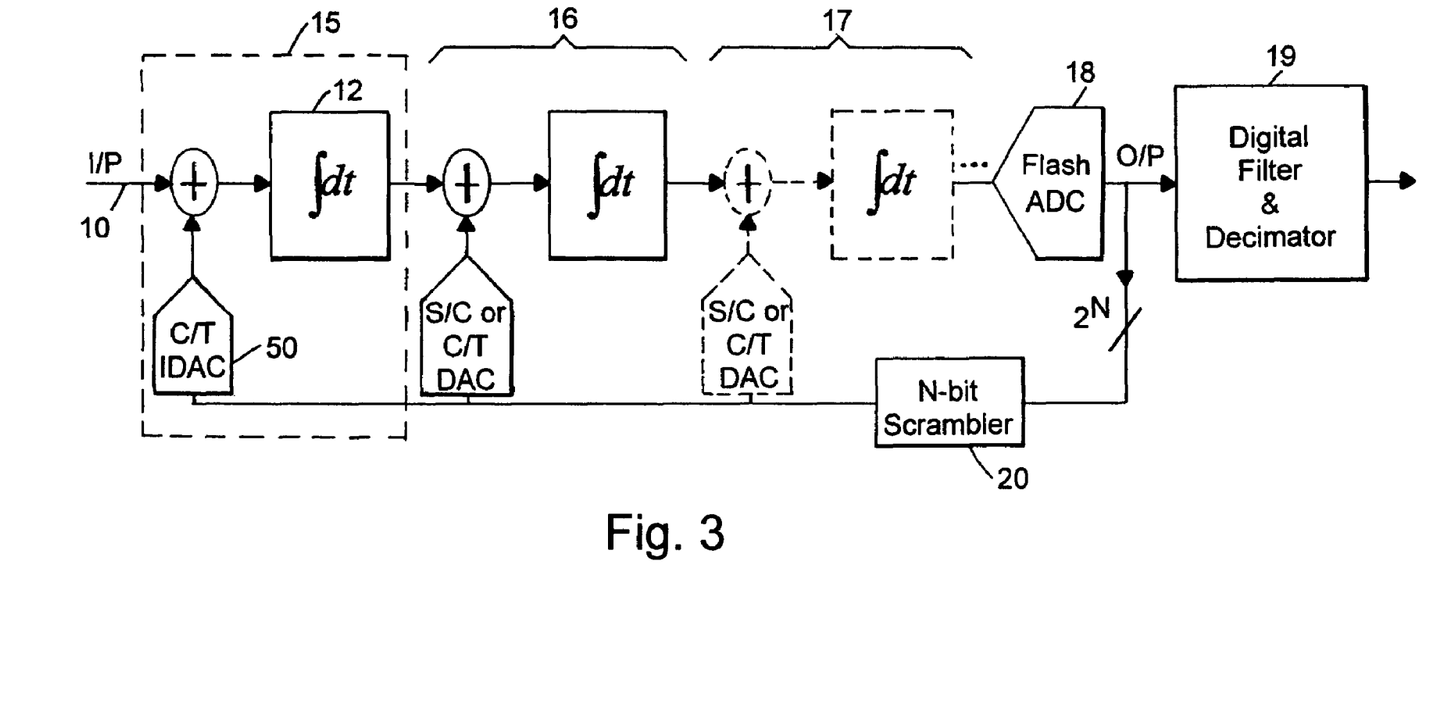
FIG. 3 schematically shows a multi-bit sigma delta ADC in accordance with the invention.

FIG. 3 schematically shows the topology of the multi-bit sigma delta ADC. This operates in broadly the same manner as FIG. 1 previously described. The front-end 15 operates in a continuous-time manner and includes an IDAC 50. A scrambler 20 is also provided in the feedback path. As described more fully below, this operates on the feedback signal to vary the selection of IDACs.

Figure 4:
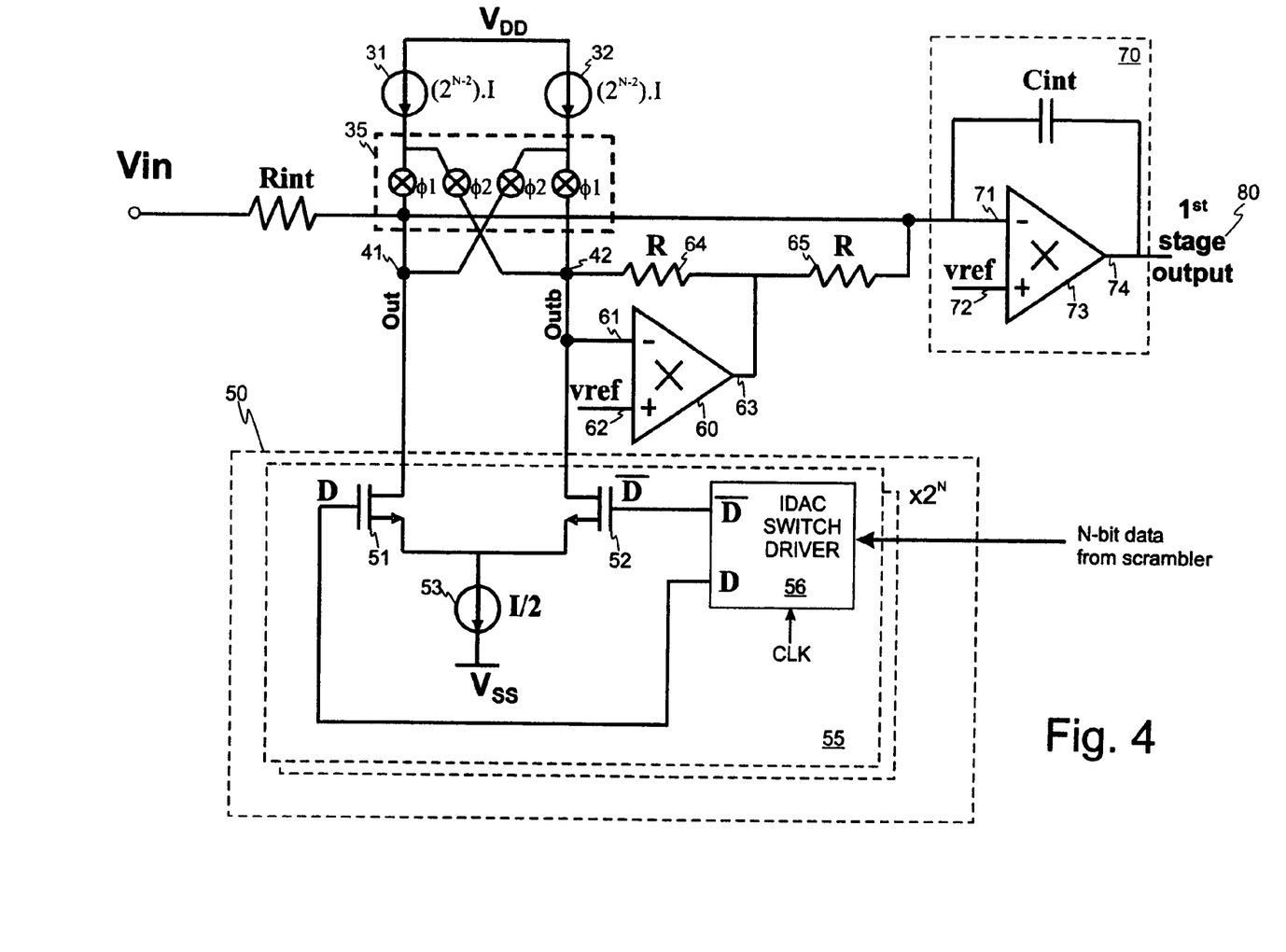
FIG. 4 shows a modified single-ended front-end for use in the converter of FIG. 3.

A front-end of an ADC according to a first embodiment of the invention is shown in FIG. 4. This corresponds to stage 15 of FIG. 3. The front-end has a single-ended input Vin and a single-ended output 80. Typically, an input signal will connect to Vin via a dc decoupling capacitor (not shown). The front-end comprises two DC biasing current sources 31, 32 which each supply a bias current of value $2^{N-2}.I$, where N is the number of bits used for the multi-bit feedback signal. A first biasing current source 31 is connected between a supply rail $V_{DD}$ and a summing node 41 via chopping switches 35. A second biasing current source 32 is connected between the supply rail $V_{DD}$ and a node 42 via chopping switches 35. A multi-bit current digital-to-analog converter (IDAC) 50 is connected to the nodes 41, 42. The IDAC comprises a set of $2^N$ unit IDACs, one of which is shown as 55 in FIG. 4. The IDAC 50 receives a multi-bit (i.e. N-bit) digital feedback signal which is used to select a number of the unit value IDACs 55. Each unit IDAC 55 comprises a current source 53, having a value of I/2. A first end of the current source 53 is connected to a supply rail $V_{SS}$. A first branch of each IDAC is connected between the second end of the current source 53 and summing node 41 via a switch 51. A second branch of each IDAC is connected between the second end of the current source 53 and node 42 via a switch 52. Each IDAC 55 receives a selection signal which is applied to an IDAC switch driver 56. The switch driver 56 generates a D and a D bar selection signal, with the D signal being applied to switch 51 and the D bar signal being applied to switch 52. In this manner, the branches of the IDAC are differentially-driven. Switch driver 56 responds to a clock signal which switches the outputs (D, D bar) in a symmetrical manner.

A set of chopping switches 35 alternately connect the biasing current sources 31, 32 to the nodes 41, 42 in a first configuration and a second configuration. In a first configuration biasing current source 31 connects to node 41 and biasing current source 32 connects to node 42 (as previously described). In this configuration the switches Φ1 are closed and switches Φ2 are open. In a second configuration the current sources are swapped around, with biasing current source 31 connecting to node 42 and biasing current source 32 connecting to node 41. In this configuration the switches Φ2 are closed and the switches Φ1 are open. A single-ended input signal Vin connects to node 41 via a resistor Rint.

Node 42 connects to an inverting input 61 of an op-amp 60. The non-inverting terminal 62 of op-amp 60 receives a reference voltage vref. Op-amp 60 in conjunction with resistor R 64 acts as a current-to-voltage converter. The output 63 of op-amp 60 is connected to node 42 via a resistor 64 of value R and to summing node 41 via a resistor 65 of value R. Node 41 connects to the summing junction of an integrator stage 70. Resistors 64, 65 are preferably of equal value in order to cancel differentially the supply noise and the even harmonics.

The integrator stage 70 comprises an op-amp 73 with an inverting input 71 which connects to node 41 and a non-inverting input 72 which receives a reference voltage vref. The output 74 of op-amp 73 connects to the inverting input 71 via an integrator capacitor, Cint, in the feedback path.

The operation of the circuit will now be described. Flicker noise on the gate of the unit current source 53 translates into a low frequency noise current when connected to node Out or Outb. When this noise current is connected to Outb via switch 52 its polarity is effectively inverted as seen at the summing junction 41 by the current-to-voltage arrangement in conjunction with resistor R 65. When this noise current is connected to node Out by switch 51 its polarity is un-altered as seen at the summing junction 41. When this noise current is switched between both paths Out and Outb at a sufficiently fast enough rate then their effects are summed or averaged to zero as seen at the summing junction. Stated another way, the Outb current in the second branch of the IDAC is converted to a voltage by the IDAC current-to-voltage converter (op-amp 60) and is converted back to a current with inverted polarity by the resistor 65 at the output of the current-to-voltage amplifier. This current is summed at the summing junction 41 with the current derived from the current Out. Currents derived from the Out current pull current in the direction away from the summing junction 41, while currents derived from the Outb current push currents into the summing junction 41. The currents are equal in magnitude but opposite in sign.

The fact that the two different current paths to the summing junction 41 keep a differential structure allows the flicker noise of the current source to be shifted or modulated (also known as chopper stabilized) to an undesirable (high) frequency that can be later removed by filtering. This structure also allows even harmonic cancellation from the distortion produced by the switching of the current sources themselves. This structure also allows chopping of the DC biasing current sources, which was previously not possible in a single-ended structure. The DC biasing current sources allow the input to the ADC to be centered at mid-range within the output code range of the ADC itself.

For most applications, an input signal is connected externally to node Vin via a dc decoupling capacitor (not shown). With no input signal present Vin will equal Vref. In this condition there will be no current flow through input resistor Rint. When using a 4-bit IDAC in the feedback path there is a total set of $2^4$ (16) unit IDACs 50, each having a current source 53. During a state where there is no input signal (i.e. ADC at mid-scale) eight of these current sources 53 will be connected through the switches labelled D 51 to node Out 41 while the other eight current sources 53 will have their currents pulled through the switches driven by D bar 52 to node Outb 42. The function of the upper current sources 31, 32 is to balance these currents such that there is no net current flow into, or out of, the summing junction 41 for the continuous-time integrator. In effect, the upper current sources 31, 32 are providing the mid-scale current bias that enables the IDACs 50 to output currents above and below mid-scale. Since the sigma-delta loop operates as a closed loop control system, the feedback code tracks the input signal. The function of the lower current sources 53 is to balance the input signal current that is flowing through the input resistor. The difference between the feedback current from the IDAC and the input current from the input resistor Rint is known as the error current. This error current is effectively transferred through to the integrator stage 70.

Figure 5:
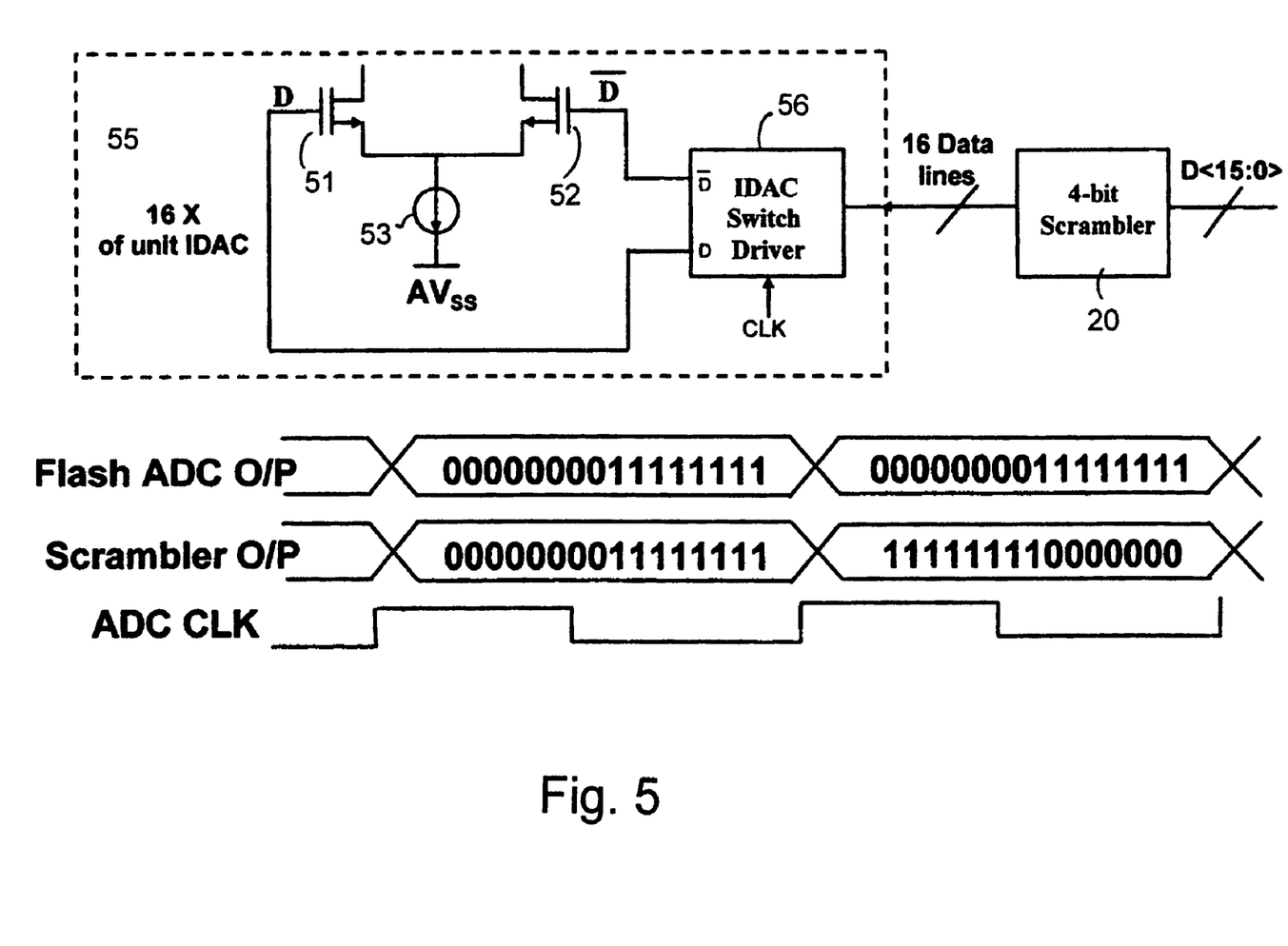
FIG. 5 shows operation of the scrambler.

FIG. 5 shows operation of the scrambler used in the circuits of FIGS. 3 and 4. Each unit IDAC 55 is selected by a data line. The data is thermometer coded so that in this example of a 4 bit IDAC there are $2^4$=16 data lines, one data line for each unit IDAC 55, which can take a value in the range 0–16. A data-directed scrambler 20 selects combinations of IDAC unit elements on a pseudo-random basis. FIG. 5 shows an example situation where the required feedback value is 8. This requires eight of the unit IDACs 55 to be turned on. Rather than selecting the same set of eight IDACs on each occasion, the scrambler selects a different combination of IDACs on a pseudo-random basis to achieve the desired feedback current. In the simplest case, this selects the set of IDACs '0000000011111111' on a first cycle and the set of IDACs '1111111100000000' on a second cycle. The scrambler can, of course, select other combinations of IDACs to achieve a value of 8. The use of the scrambler 20 to select different combinations of IDACs has been found to have a chopping effect on flicker noise. For low level input signals, the output codes from the scrambler provide a spectrum that inherently chops the current source flicker noise to a high frequency that is later removed by filtering.

Figure 6:
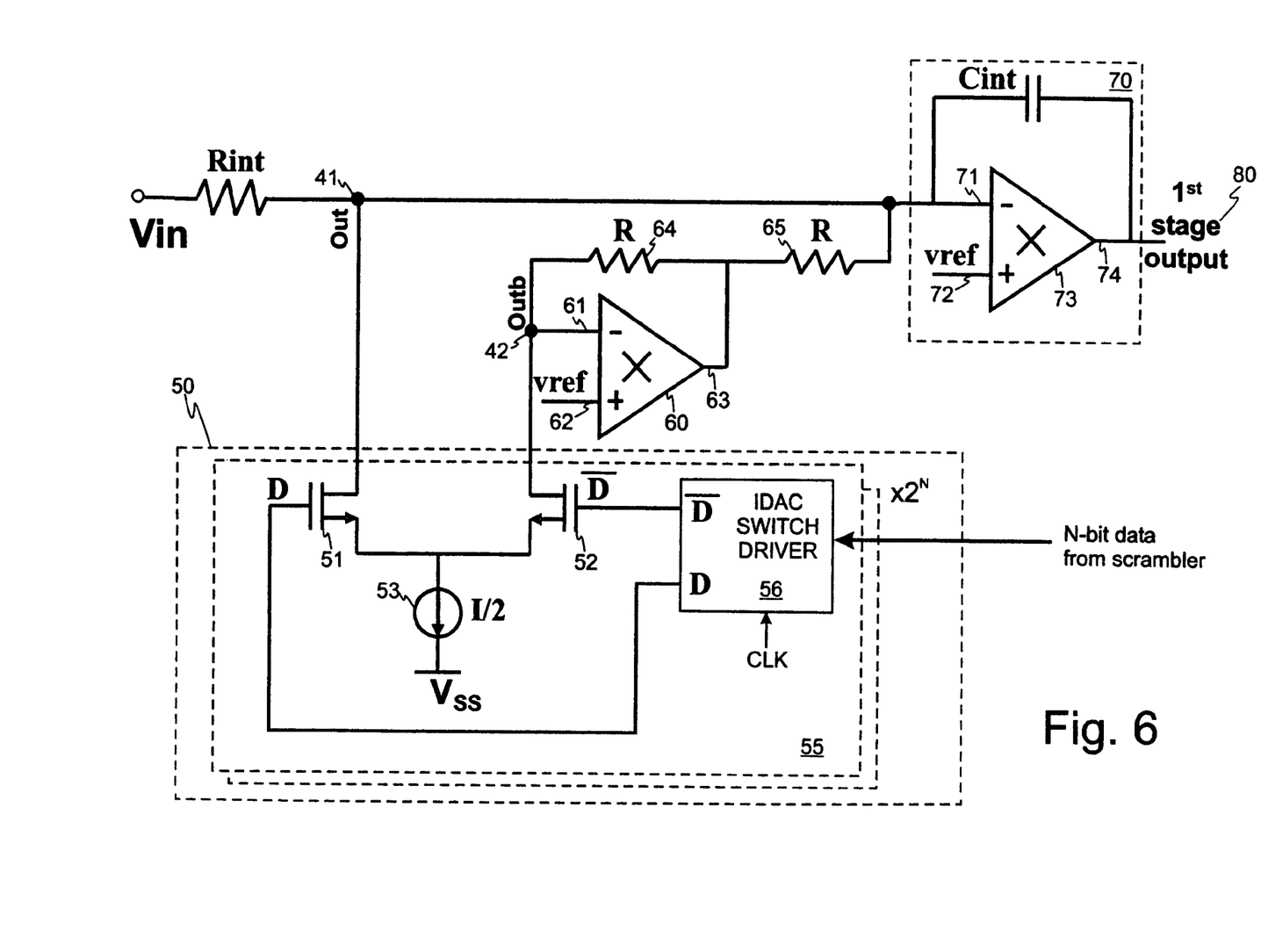
FIG. 6 shows another modified single-ended front-end for use in the converter of FIG. 3.

A front-end according to a second embodiment of the invention is shown in FIG. 6. In this embodiment the biasing current sources 31, 32 and chopping switches 35 of FIG. 4 are removed. The other components are the same as shown in FIG. 4 and similar numbering is used. The inclusion of the amplifier 60 and resistor 64, which together form a current-to-voltage converter, along with the extra resistor 65 ensures that the IDAC produces a net zero current flowing into the summing junction 41 during mid-scale range. By removing the DC biasing current source, there is a benefit of an improved noise performance as the DC biasing current sources no longer contribute noise.

To illustrate operation of this arrangement, assume a mid-range (no input signal) condition where a 16 bit thermometer coded signal from the scrambler comprises 8 bits set high and 8 bits set low. This signal is applied to the 16 IDACs 50. This will set eight of the IDACs 50 to have D enabled high. This causes current sources 53 of those IDACs to pull current out of the summing junction through node 'Out'. The other eight IDACs have D set low, meaning that the current sources 53 of those IDACs have their current flowing through 'Outb'. The current that is being drawn from 'Outb' is sourced by the op-amp 60. This creates a voltage greater than 'vref' at the output 63 of the op-amp 60 since that current must flow through the leftmost resistor 64. In creating that positive voltage above vref at the output 63 of the op-amp 60, this in turn injects a current that is equal in magnitude to the current flowing through node 'Outb' into the summing junction 41 through the rightmost resistor 65. So, the current that is drawn from the summing junction through the path denoted by 'Out' is balanced by the current that is injected by the other path. As the paths are balanced the uppermost (PMOS) current sources 31, 32 shown in FIG. 4 are no longer required.

The front-end according to the invention provides a differential path for the IDAC current to flow to the summing junction while also providing a single-ended output current for a single-ended input continuous-time ADC.

Another benefit of the front-end according to the invention is that the total current through the switching portion of the IDAC is half that of the prior art. Comparing FIGS. 4 and 6 to FIG. 2, the current source within each unit IDAC has a value of I/2 rather than I. This is because all IDAC currents in the front-end configurations of FIGS. 4 and 6 are used to cancel the incoming signal current whereas the prior art shown in FIG. 2 employed a throw-away node that made use of half of the currents redundant when at mid-scale.

In the arrangement shown in FIG. 4, where bias current sources 31, 32 are used, explicit chopping switches 35 and a sufficiently high frequency clock are required to chop the DC biasing current source flicker noise. In the arrangement of FIG. 6 the switching properties of a data-directed scrambler 20 employed in the feedback path of a multi-bit ADC allow chopping of the noise of IDAC sources 53 to be accomplished without the need to explicitly employ chopping switches and high-frequency clocks. The present invention also allows the flicker noise of the IDAC current-to-voltage amplifier and the integrator amplifier to be chopped. Another added benefit is that the total current through the switching portion of the IDAC is half that of a conventional arrangement as shown in FIG. 2. This is because all currents are used to cancel the incoming signal current whereas the prior art employed a throw-away node that only made use of half of the currents when operating at mid-scale.

Figure 7:
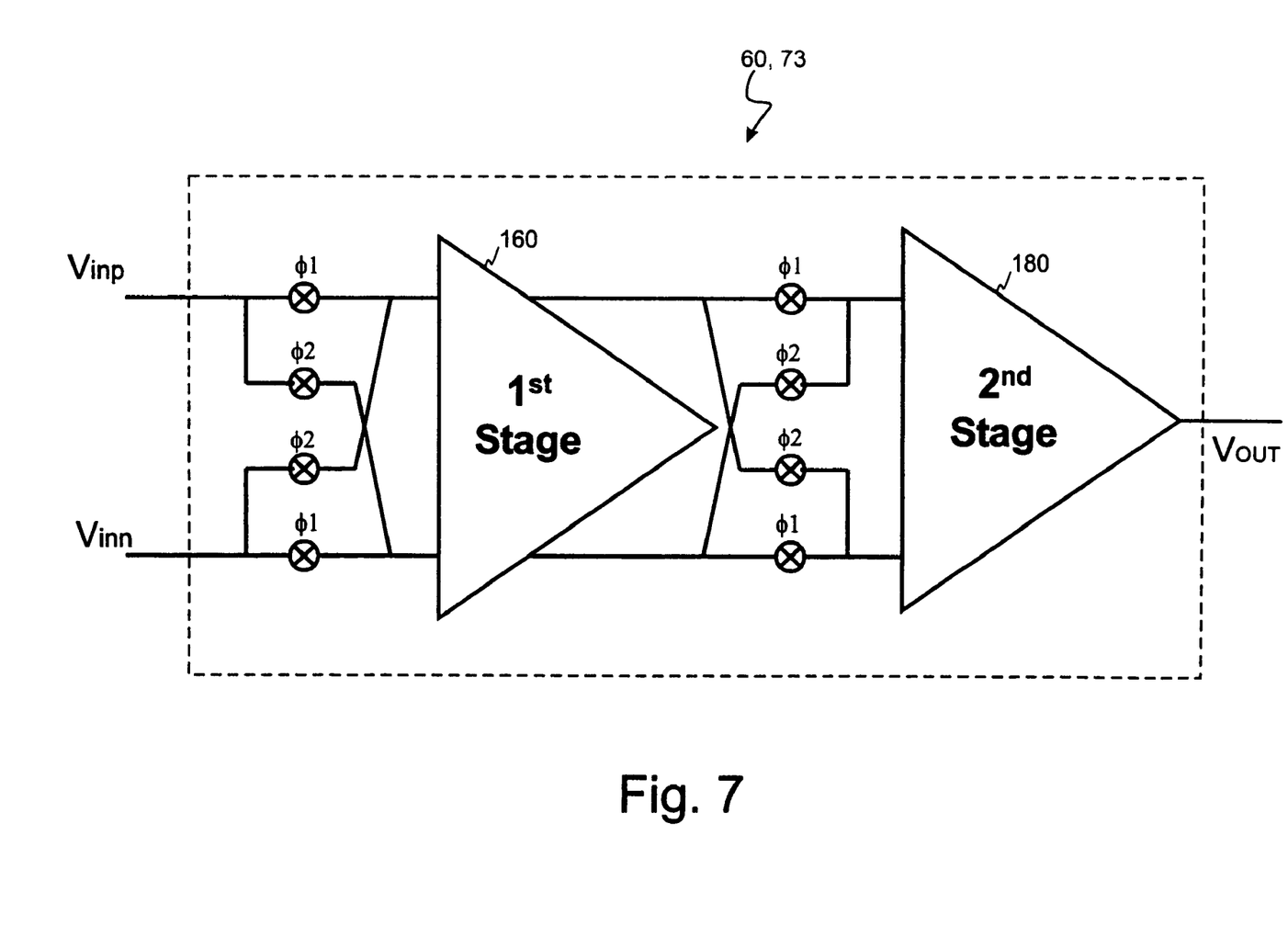
FIG. 7 schematically shows the two-stage amplifier used within the front-end of FIGS. 4 and 6.
Figure 8:
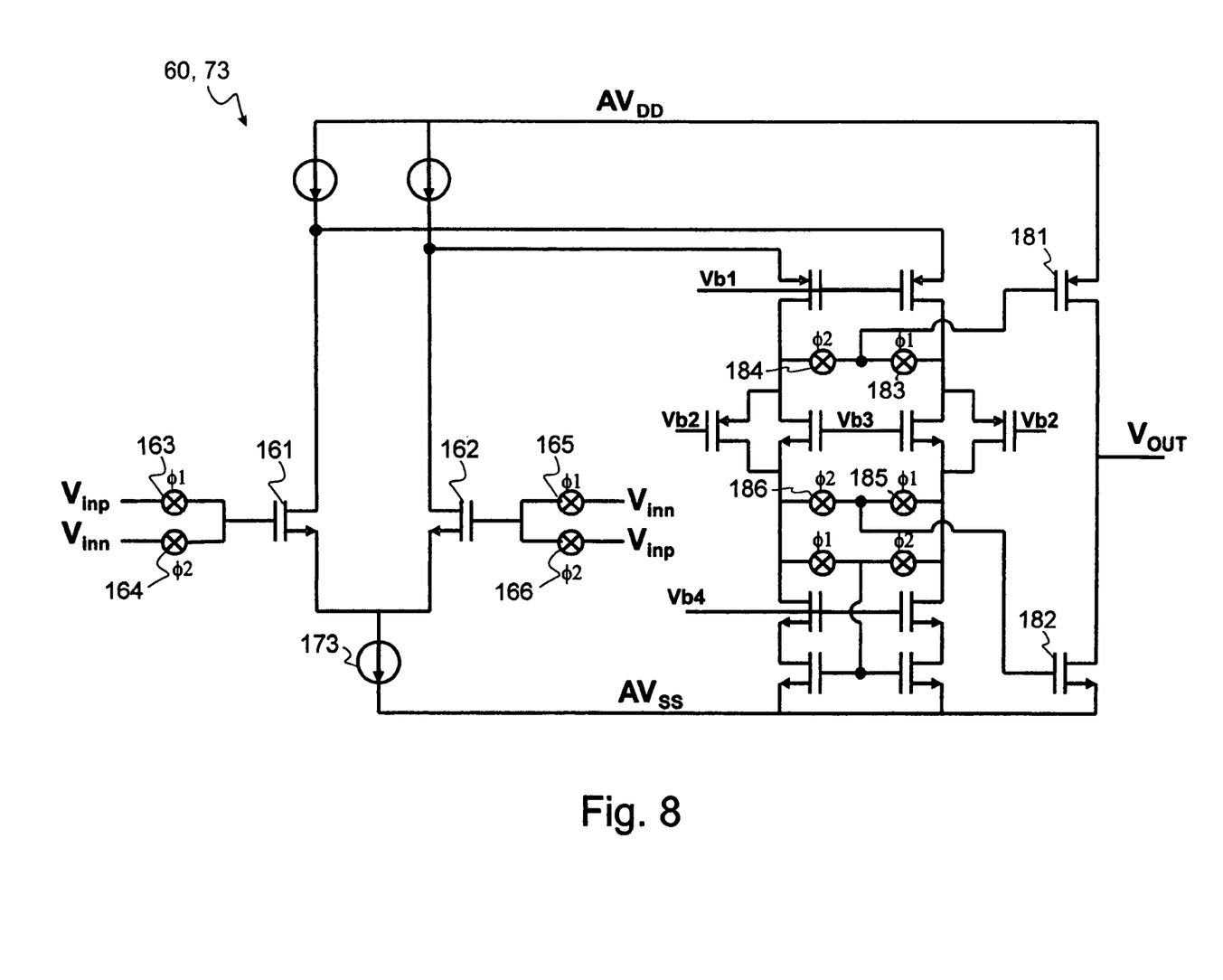
FIG. 8 shows the two-stage amplifier of FIG. 7 in more detail.

It is preferred that the current-to-voltage amplifier 60 and the integrator amplifier 73 in FIGS. 4 and 6 are each chopper-stabilized. FIGS. 7 and 8 show one example embodiment of a chopper-stabilized amplifier which is suitable for use as the IDAC amplifier 60 and integrating amplifier 73. This is a single-ended output Class-AB amplifier although it will be appreciated that other designs could equally be used. The amplifier has two gain stages 160, 180. The first gain stage 160 receives a pair of differential inputs Vinp, Vinn and includes an input pair of devices 161, 162 shown in FIG. 8 which are loaded by a folded cascade stage. The second gain stage 180 comprises a pair of devices 181, 182 which are coupled together to form a single-ended output VOUT. The devices driven off Vb2 and Vb3 form a Class-AB biasing scheme for the second stage. The signals applied to the gates of devices 181, 182 form the outputs of the first gain stage. The first gain stage 160 differential inputs Vinp, Vinn are connected to devices 161, 162 via chopping switches 163–166. The outputs of the first gain stage are also chopped via chopping switches 183–186. The polarity within the amplifier alternates during each of the two cycles of operation, with switches Φ1 being closed and switches Φ2 open during the first cycle, and switches Φ1 being open and switches Φ2 closed during the second cycle. This has the effect of swapping the inputs and outputs of the first stage 160 between alternate cycles. It can be seen that during a first cycle Vinp is connected to the gate of device 161 via switch 163 and Vinn is connected to the gate of device 162 via switch 165. During a second cycle Vinn is connected to the gate of device 161 via switch 164 and Vinp is connected to the gate of device 162 via switch 166. The use of an amplifier having two stages, with chopper stabilization only of the first stage, has been found to provide a performance advantage in a continuous time ADC circuit.

The chopping switches 163–166, 183–186 within amplifiers 60, 73 and the chopping switches 35 can operate over a wide range of clock rates. In a circuit designed for television audio applications the circuit received a general circuit clock signal at a rate of 6.14 MHz and this clock signal was applied directly to the chopping switches. However, the circuit has also been operated at sub-multiples of this clock rate (e.g. 3.07 MHz) with similar results. In general, the chopping switches can operate at the same rate ($F_S$) as the main clock for the sigma-delta modulator or at binary subdivisions of the modulator clock rate, e.g. $F_S/2$, $F_S/4$, $F_S/8$.

The single-ended ADC front-end 15 shown in FIG. 2 and described above provides a lot of the advantages of a differential architecture while providing a single-ended output for feedback IDAC. In summary, the invention enables:
 (1) supply noise to be differentially cancelled in the IDAC structure;
 (2) even order harmonic cancellation produced with the IDAC because of the differential architecture;
 (3) chopping of the IDAC current source flicker noise;
 (4) chopping of the DC bias current source if a DC bias current source is used;
 (5) removal of the DC biasing current source;
 (6) a reduced current to be dissipated in the IDAC.

Figure 9:
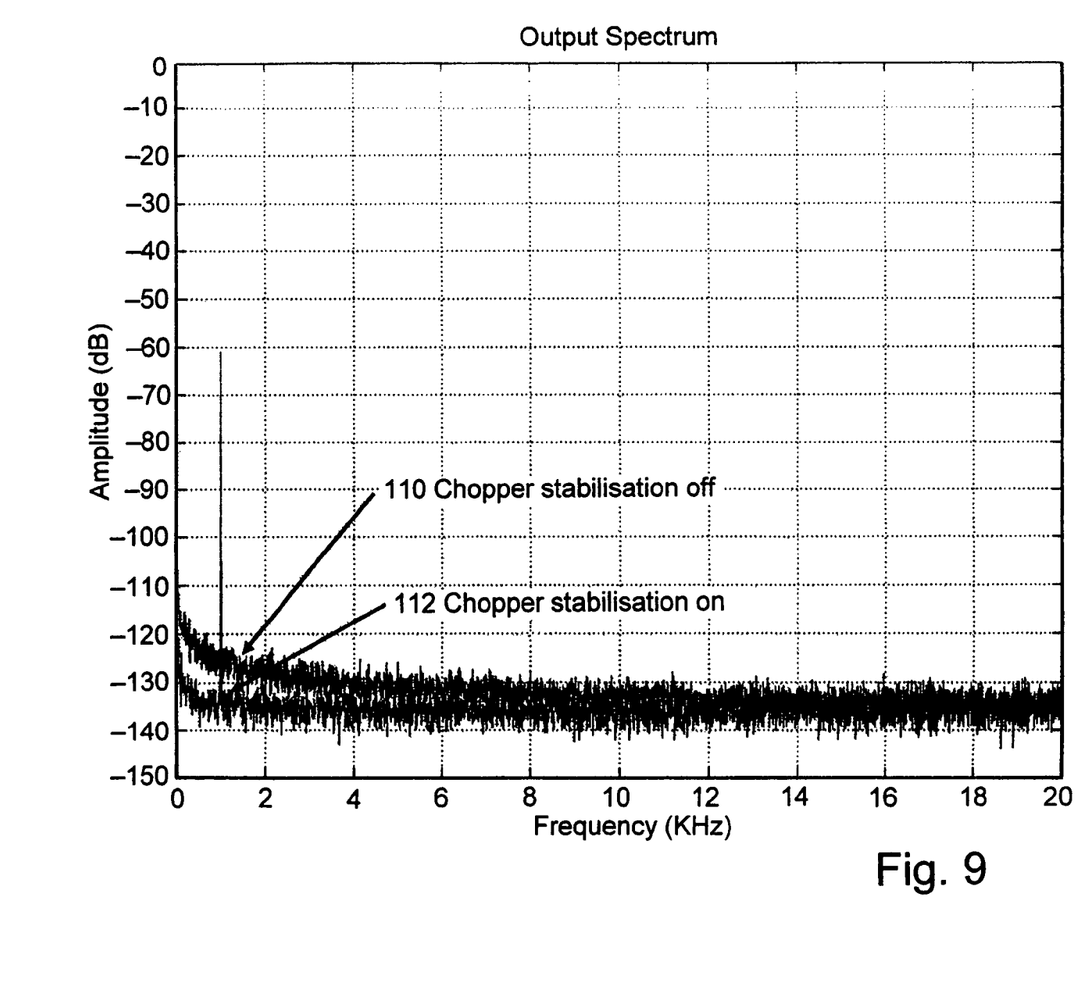
FIG. 9 shows performance of a converter according to the invention.

FIG. 9 compares the noise performance of a front-end of the type shown in FIG. 4 without (trace 110) and with (trace 112) chopper stabilization. The input signal is a –60 dB full scale 1 KHz input signal.

In FIGS. 4 and 6, the selection signal (D) is applied to NMOS transistors 51, 52 and the bias current is provided by PMOS current sources 31, 32. It is possible to reverse the architecture. In this 'opposite' architecture the selection signal (D) is applied to PMOS transistors and the bias current is provided by NMOS current sources.

The invention is not limited to the embodiments described herein, which may be modified or varied without departing from the scope of the invention.

The invention claimed is:

1. A multi-bit sigma-delta analog-to-digital converter (ADC) comprising:
 a single-ended input for receiving an analog input signal;
 a multi-bit feedback current digital-to-analog converter (IDAC) which is operable to generate a multi-level feedback current depending on a feedback signal;
 a summing node which is operable to sum the input signal with the feedback current; and
 an integrator which is operable to integrate the summed signal on a continuous-time basis;
wherein the IDAC is selectively connectable to the summing node via a first path and a second path, the first path transmitting current from the IDAC to the summing node with a first polarity, and the second path transmitting current from the IDAC to the summing node with an inverted polarity, and
 wherein the IDAC comprises a set of unit IDACs which are each selectively connectable to the summing node via one of a first path and a second path, the first path transmitting current from the IDAC to the summing node with a first polarity, and the second path transmitting current from the IDAC to the summing node with an inverted polarity.

2. A converter according to claim 1 in the form of an integrated circuit.

3. A converter according to claim 1 wherein the feedback signal individually selects each unit IDAC, the second path of each IDAC receiving an inverted version of the feedback signal applied to the first path of each IDAC.

4. A converter according to claim 1 wherein the first path pulls current from the summing node and the second path injects current into the summing node such that the set of IDACs can bias the converter in a mid-scale condition without bias current sources.

5. A converter according to claim 1 wherein the IDAC comprises a set of unit IDACs which are selectable by the feedback signal, the feedback signal being scrambled so as to vary the selection of unit IDACs for each level of feedback current.

6. A converter according to claim 1 wherein the second path comprises a current-to-voltage converter and a first resistor.

7. A converter according to claim 6 wherein the current-to-voltage converter comprises an amplifier having an inverting input which connects to the IDAC and an output which connects to the inverting input via a second resistor.

8. A converter according to claim 6 further comprising a first biasing current source which connects to the summing node and a second biasing current source which connects to the input of the current-to-voltage converter.

9. A converter according to claim 8 wherein the biasing current sources are connected to the converter by chopping switches, the biasing current sources being connectable in a first configuration where the first biasing current source connects to the summing node and the second biasing current source connects to the input of the current-to-voltage converter and a second configuration where the first biasing current source connects to the input of the current-to-voltage converter and the second biasing current source connects to the summing node.

10. A converter according to claim 9 which receives a modulator clock signal at a frequency $F_s$ and wherein the chopping switches operate at $F_s$ or a binary subdivision thereof.

11. A converter according to claim 6 wherein the amplifier used in the current-to-voltage converter is chopper stabilized.

12. A converter according to claim 11 which receives a modulator clock signal at a frequency $F_s$ and wherein the current-to-voltage converter is chopper-stabilized at $F_s$ or a binary subdivision thereof.

13. A converter according to claim 11 wherein the current-to-voltage converter comprises a two-stage amplifier having a first stage with a differential input and differential output and a second stage having a differential input and single-ended output and wherein the first stage is chopper stabilized.

14. A converter according to claim 1 wherein the integrator comprises an amplifier which is chopper stabilized.

15. A converter according to claim 14 which receives a modulator clock signal at a frequency $F_s$ and wherein the integrator amplifier is chopper-stabilized at $F_s$ or a binary subdivision thereof.

16. A converter according to claim 14 wherein the integrator comprises a two-stage amplifier having a first stage with a differential input and differential output and a second stage having a differential input and single-ended output and wherein only the first stage is chopper stabilized.

17. A method of operating on an analog signal at the front end of a multi-bit sigma-delta analog-to-digital converter (ADC) comprising:

providing an analog input signal at a single-ended input;

generating a multi-level feedback current depending on a feedback signal;

summing the input signal with the feedback current; and integrating the summed signal on a continuous-time basis;

and selectively connecting the generated feedback current to the summing node via a first path and a second path, the first path transmitting said feedback current to the summing node with a first polarity and the second path transmitting current to the summing node with an inverted polarity, wherein the step of generating a multi-level feedback current uses a set of unit current sources, each current source being selectively connectable to the summing node via a first path, which transmits current to the summing node with a first polarity, and a second path, which transmits current to the summing node with an inverted polarity.

18. A signal generated from a method for operating on an analog signal at the front end of a multi-bit sigma-delta analog-to-digital converter (ADC), said method comprising:

providing an analog input signal at a single-ended input;

generating a multi-level feedback current depending on a feedback signal;

summing the input signal with the feedback current; and integrating the summed signal on a continuous-time basis;

and selectively connecting the generated feedback current to the summing node via a first path and a second path, the first path transmitting said feedback current to the summing node with a first polarity and the second path transmitting current to the summing node with an inverted polarity, wherein the step of generating a multi-level feedback current uses a set of unit current sources, each current source being selectively connectable to the summing node via a first path, which transmits current to the summing node with a first polarity, and a second path, which transmits current to the summing node with an inverted polarity.

* * * * *